(12) United States Patent
Kim

(10) Patent No.: US 7,157,965 B1
(45) Date of Patent: Jan. 2, 2007

(54) SUMMING POWER AMPLIFIER

(75) Inventor: Beomsup Kim, Campbell, CA (US)

(73) Assignee: Qualcomm Incorporated, San Diego, CA (US)

( * ) Notice: Subject to any disclaimer, the term of this patent is extended or adjusted under 35 U.S.C. 154(b) by 93 days.

(21) Appl. No.: 10/873,742

(22) Filed: Jun. 21, 2004

(51) Int. Cl.
*H03F 3/68* (2006.01)

(52) U.S. Cl. .................. 330/124 R; 330/295; 330/301

(58) Field of Classification Search ............ 330/124 R, 330/301, 295; 257/538, 380
See application file for complete search history.

(56) References Cited

U.S. PATENT DOCUMENTS

| | | | |
|---|---|---|---|
| 6,603,352 B1 * | 8/2003 | Wight | 330/251 |
| 6,670,848 B1 * | 12/2003 | Fanous et al. | 330/124 R |
| 6,731,166 B1 * | 5/2004 | Sabouri et al. | 330/124 R |
| 6,996,379 B1 * | 2/2006 | Khorram | 455/91 |
| 2004/0222849 A1 * | 11/2004 | Doi | 330/124 R |
| 2005/0179499 A1 * | 8/2005 | Fenk | 330/295 |

* cited by examiner

*Primary Examiner*—Robert Pascal
*Assistant Examiner*—Hieu Nguyen
(74) *Attorney, Agent, or Firm*—Philip R. Wadsworth; Charles D. Brown; Kenyon S. Jerckes

(57) ABSTRACT

A power amplifier comprises an amplification stage comprises a plurality of amplifiers, wherein each amplifier provides an amplified output, and an inductive summing device configured to receive the plurality of amplified outputs and provide a combined output signal. A method of amplifying a signal comprises applying the signal to an amplifier stage comprising a plurality of amplifiers, wherein each amplifier is configured to provide an amplified output, and providing a combined output signal via an inductive summing device configured to receive the plurality of amplified outputs.

28 Claims, 7 Drawing Sheets

SUMMING POWER AMPLIFIER

FIELD OF THE INVENTION

The present invention relates generally to electronic circuit design. More specifically, an amplifier is disclosed.

BACKGROUND OF THE INVENTION

Power amplifiers have a wide range of application in modern electronics, particularly in communication systems. Power amplifiers are often included in transmitters to amplify signals before transmission. FIG. 1A is a block diagram illustrating a single-ended power amplifier example. The power amplifier shown in this example includes a first amplification stage 100 and a second amplification stage 102. The amplified signal is to be transmitted via antenna 104. Antenna 104 may experience a significant amount of electro-static discharges because it is exposed to the environment. In this single-ended configuration, since the antenna is directly connected to the output of the second stage amplifier, the electro-static discharges may negatively impact the performance and functionality of the second stage amplifier. In a cellular phone system, for example, the voltage swing at the output of the second stage amplifier may exceed the power supply voltage, possibly causing damage to integrated circuit (IC) devices and leading to long term reliability issues. It is desirable for the second stage amplifier to maintain its functionality and performance under potentially harsh conditions. Additionally, a single-ended amplifier is susceptible to power supply noise. A regulator is commonly used to reduce the power supply noise and fluctuation.

FIG. 1B is a block diagram illustrating a differential power amplifier example. Differential power amplifier 160 shown in this example includes a first amplification stage 150 and a second amplification stage 152. Differential amplifiers have better power supply rejection performance than single-ended amplifiers and can more effectively reduce power supply noise. Since antenna 154 is a single-ended device, a transformer 156 (also referred to as a balun) is used to convert the balanced output of the double ended amplifier to an unbalanced signal to be transmitted by antenna 154. Balun 156 electrically isolates the output of the second stage from the antenna and ameliorates the problems associated with electro static discharges. Although the design shown in FIG. 1B is useful for noise reduction and electrical isolation from the antenna, some problems still remain in its implementation. The coils of the inductors in balun 156 introduce resistance, which is especially significant when the inductors are implemented in a monolithic form such as spiral inductors in IC devices. Multiple loops in the inductive coil are usually required in order to achieve the desired inductance. As the length and resistance of the inductor increases, the number of loops increases, leading to greater power dissipation and reduced overall system efficiency. The resistance introduced by the inductive coils is particularly problematic for IC devices since power consumption is typically an important consideration, especially for battery operated devices. It would be desirable to have an amplifier design that would provide good power efficiency. It would also be useful if the amplifier can be used in transmitter circuits and provide good isolation between the amplification stages and the antenna.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A power amplifier design is disclosed. In some embodiments, the power amplifier includes an amplification stage comprising a plurality of amplifiers. The outputs of the amplifiers are combined by an inductive summing device. In some embodiments, the inductive summing device includes multiple inductive loops wherein each of the loops connects to an amplifier and wherein each of the loops is mutually inductive. The overall resistance of the inductive summing device is therefore reduced. The amplifiers are preferably laid out in a symmetrical configuration or delay compensated. In some embodiments, some of the amplifiers may be selectively enabled or disabled to vary the amount of amplification.

Figure 2:
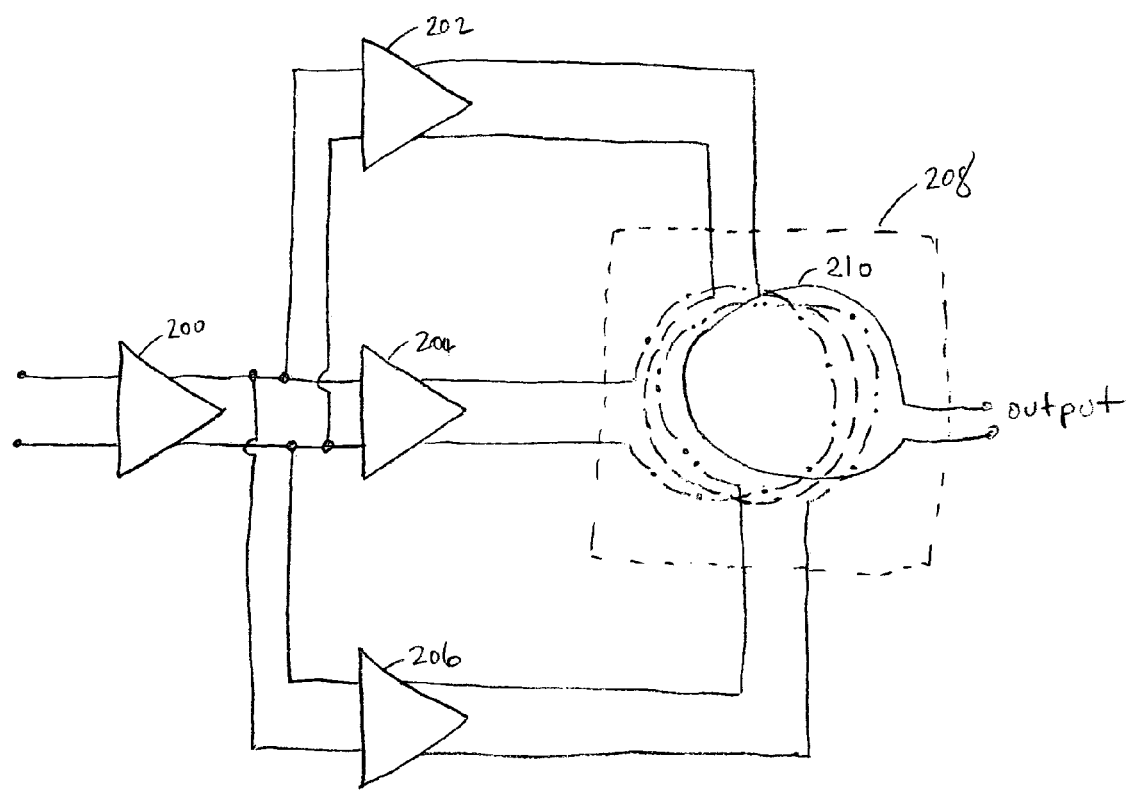
FIG. 2 is a schematic diagram illustrating a transmitter embodiment.

FIG. 2 is a schematic diagram illustrating a transmitter embodiment. In this example, the transmitter includes a pre-amplifier 200 (also referred to as a preamp), and an amplification stage that includes amplifiers 202, 204, and 206, which are connected in parallel. The number of amplifiers in the amplification stage may vary for different embodiments. In some embodiments, the preamp is omitted.

In this example, the amplifiers are differential amplifiers, each having a pair of outputs that form an inductive loop. For the purpose of illustration, in the example shown, the inductive loops formed by amplifier 202, 204 and 206 are represented using dashed lines, dash dot lines, and dash double dot lines, respectively. Each inductive loop is connected to a corresponding amplifier. An additional inductive loop 210 (represented as a solid line) provides the output, which may be applied to an antenna for transmission. As such, the output signal is electrically isolated from the rest of the amplifier circuit. In some embodiments, one of the output terminals is connected to ground so that the output is unbalanced. The inductive loops are configured in a mutually inductive manner to form an inductive summing device 208. For the purpose of illustration, single loops are shown in this example. Multiple loops or coils are used in some embodiments.

Figure 1A:
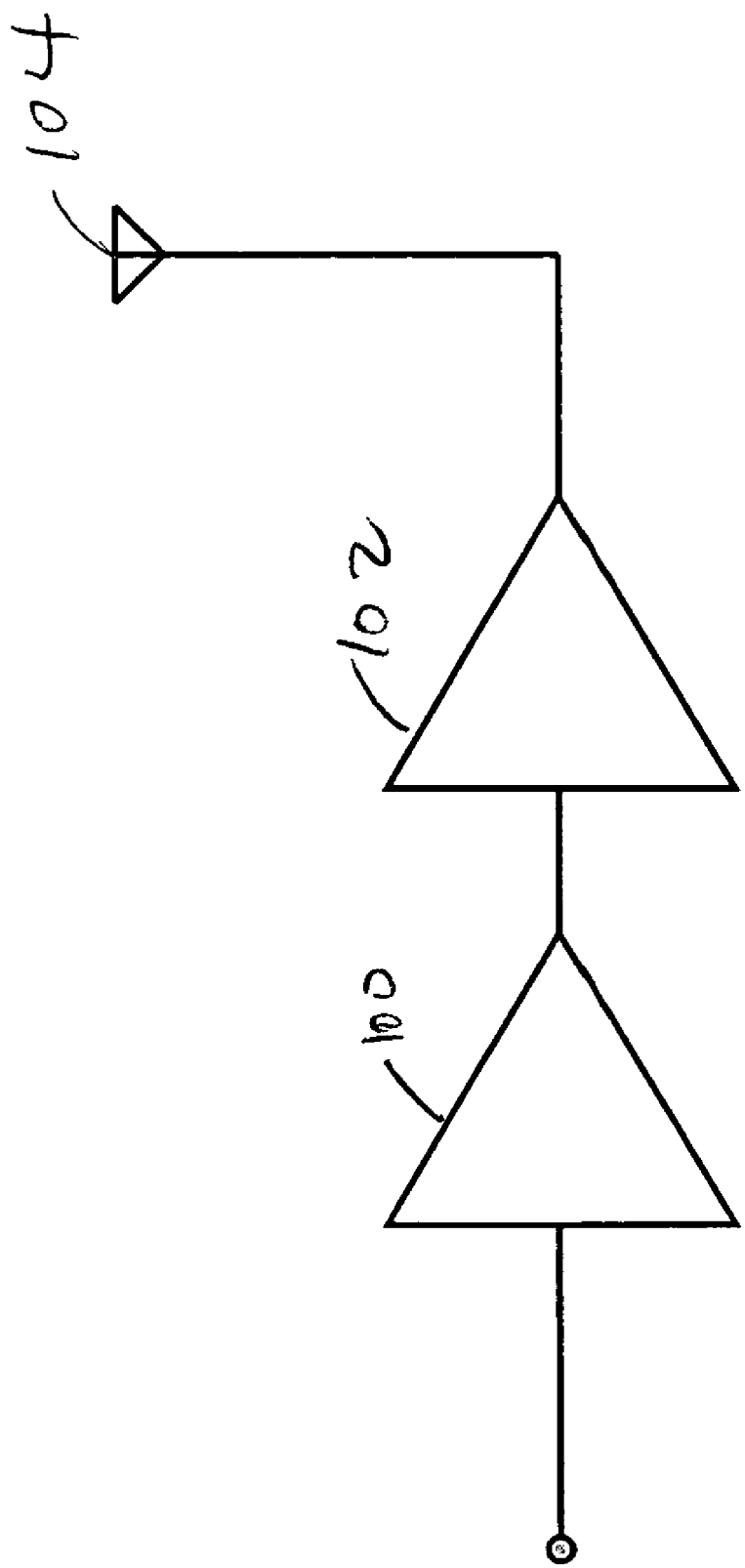
FIG. 1A is a block diagram illustrating a single-ended power amplifier example.
Figure 1B:
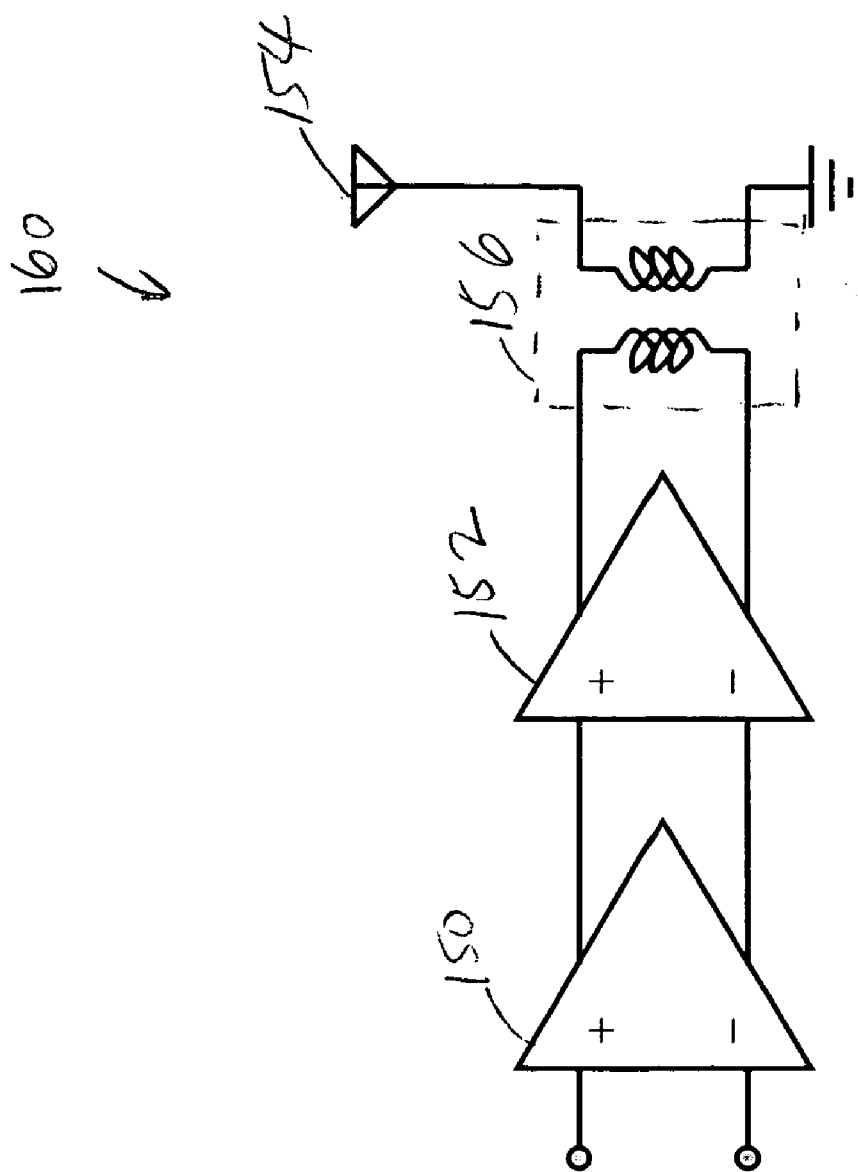
FIG. 1B is a block diagram illustrating a differential power amplifier example.

Each inductor is laid out so that the area in which its flux is contained substantially coexists with the flux area of the other inductors that comprise the inductive summing device. The inductive summing device is configured to receive the amplified output from the amplifiers, and to provide a combined output signal. The separate loops in inductive summing device 208 are mutually inductive, and the mutual inductance alleviates the need for each inductor to have a large number of coils. Each of the several individual loops has fewer coils than the single monolithic inductor that is replaced. Thus, the resistance of each loop is relatively small, and the resulting resistance of inductive summing device 208 is a fraction of a monolithic inductor (such as the inductors used in transformer 106 of FIG. 1). Besides the layout shown in this example, there are several other ways to lay out the inductive loops, some of which are discussed in co-pending U.S. patent application Ser. No. 10/101,560 entitled SYNCHRONOUSLY COUPLED OSCILLATOR filed Mar. 18, 2002, which is incorporated herein by reference for all purposes.

In addition to the smaller resistance resulting from inductive summing device 208, the gain required for amplifiers 202–206 is less than the gain of single amplifier 102 in the previous example. Since the total amount of amplification achieved by using multiple amplifiers in the amplification stage is approximately the sum of the amplifiers, each of amplifiers 202–206 may provide ⅓ as much amplification as amplifier 102 shown in FIG. 1 and the system can still achieve the same amount of total gain as amplifier 102. As a result, the biasing and linearity requirements of amplifiers 202–206 are less stringent than amplifier 102.

Figure 3A:
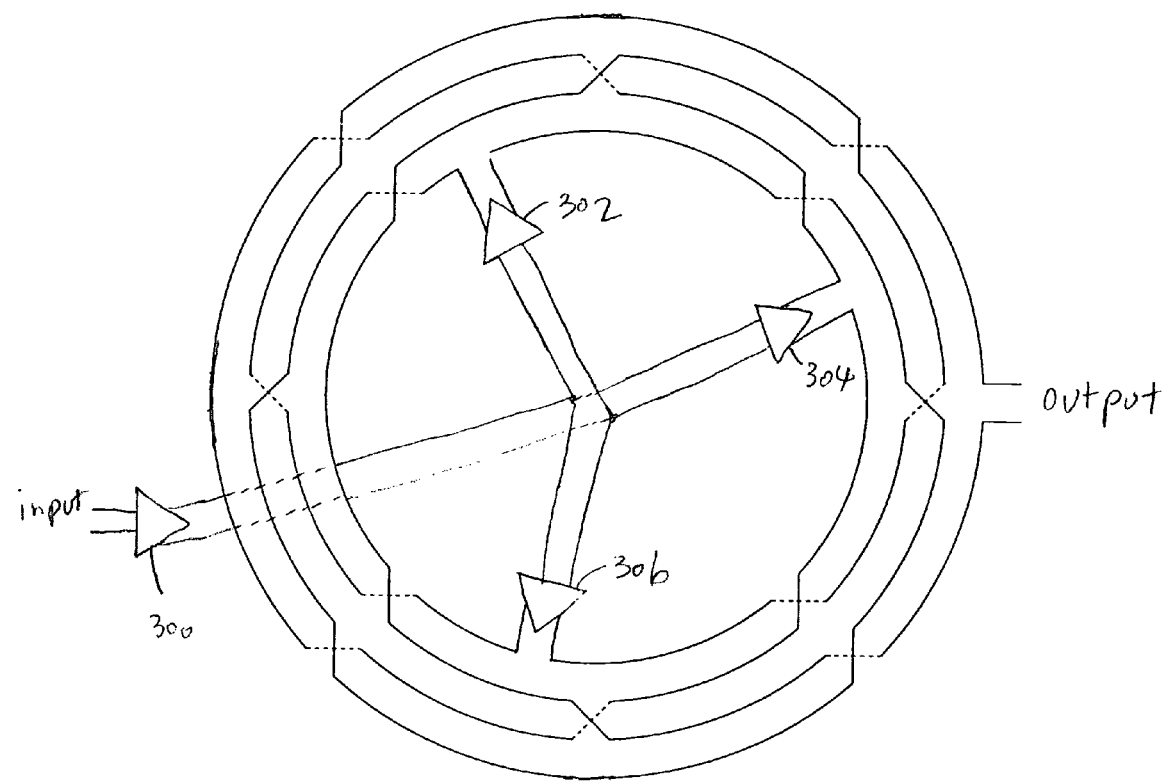
FIG. 3A is a schematic diagram illustrating the layout of another transmitter embodiment.

FIG. 3A is a schematic diagram illustrating the layout of another transmitter embodiment. In this example, preamp 300 amplifies the input and sends the amplified signal to an amplification stage comprising amplifiers 302–306. Amplifiers 302–306 are configured in parallel. The amplifiers, the inductive coils associated with the amplifiers and the inductive coil used for providing the output are on the same IC chip and are laid out in approximately symmetrical configuration. The symmetrical configuration allows amplifiers 302–306 to have approximately the same input phase delays. The flux area of the inductors associated with the amplifiers substantially overlaps. The layout may be implemented using a multilayer metal structure. Each conductor that forms a loop begins at a first upper layer, then transitions to a second lower layer to pass under another inductor when that is required and then transitions back to the first layer. Dashed lines are used to illustrate the crossing of one wire line under another.

Figure 3B:
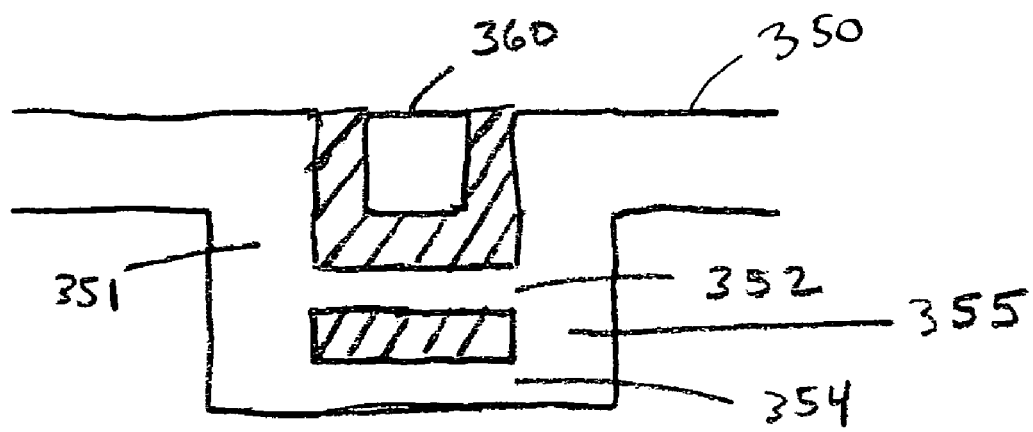
FIG. 3B is a diagram illustrating in detail how one inductor passes below another inductor at a crossing point.

FIG. 3B is a diagram illustrating in detail how one inductor passes below another inductor at a crossing point. Preferably, the inductors are laid out on a top metal layer. Depending on the manufacturing process, the top metal layer may be thicker (on the order of two or three times thicker in some embodiments) than the second layer that is just below the top layer. When the top layer is thicker than the lower layers, the lower layers tend to have higher resistance. This problem can be ameliorated by connecting the top layer to two or more lower layers in parallel. At a crossing point, one inductor is interrupted in the top layer and is connected to one or more lower layers using one or more vias. Once the crossing point has passed, the inductor resumes on the top layer and one or more vias connect the lower layers to the top layer.

In the example shown, inductor 350 is disposed in the top layer until a crossing point with inductor 360 is reached. Inductor 350 is interrupted in the top layer and is connected to the second layer and the third layer by via 351. Second layer portion 352 and third layer portion 354 of inductor 350 run below inductor 360. Once the crossing point is passed, via 355 connects second layer portion 352 and third layer portion 354 back to the top layer and inductor 350 resumes on the top layer. In different embodiments, different numbers of layers may be used. In general, only 2 layers are required, but additional layers may be used to lower the resistance of the portion of the inductor that drops down to a lower layer.

Figure 4:
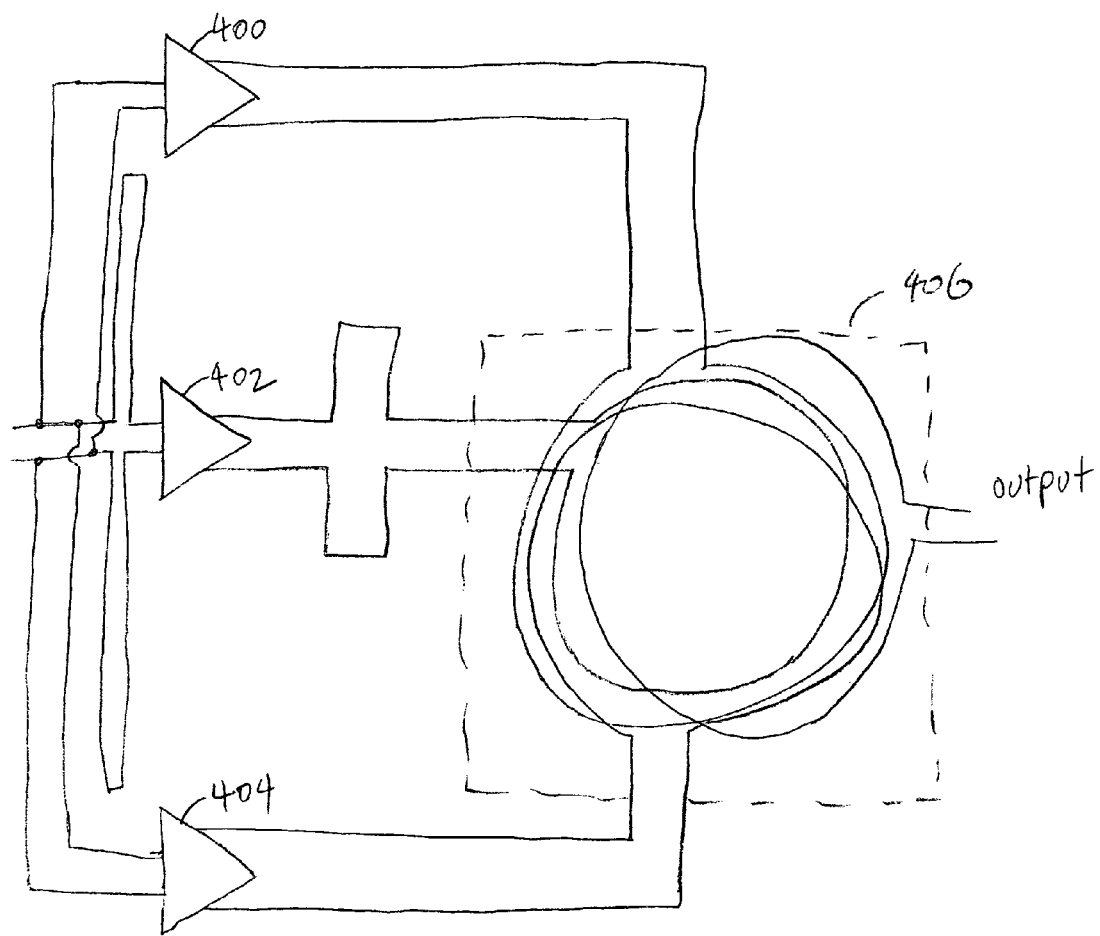
FIG. 4 is a schematic diagram illustrating another transmitter embodiment.

FIG. 4 is a schematic diagram illustrating another transmitter embodiment. Although amplifiers 400–404 of the amplification stage are not laid out symmetrically in this example, the wires used for connecting the amplifier inputs are delay compensated so that the inputs of the amplifiers have approximately the same phase. The outputs may also be delay compensated so that they have approximately the same phase upon reaching summing device 406. For example, amplifier 400 and 404 are located further away from the wires carrying the input signals as well as summing device 406 than amplifier 402. To delay compensate the signals, the input wires to amplifier 402 are extended so that the input signal reaching amplifier 402 has approximately the same phase as the input signals reaching amplifiers 400 and 406. Similarly, the output wires of amplifier 402 are also extended so that its associated inductive loop receives an amplified signal that has approximately the same phase as signals received by inductive loop associated with amplifiers 400 and 404. Although delay compensation by adjusting the wiring of the amplifiers is shown for the purpose of example, other methods of delay compensation may also be employed. For example, some of the amplifiers may include components that introduce delay to the signal paths.

Figure 5:
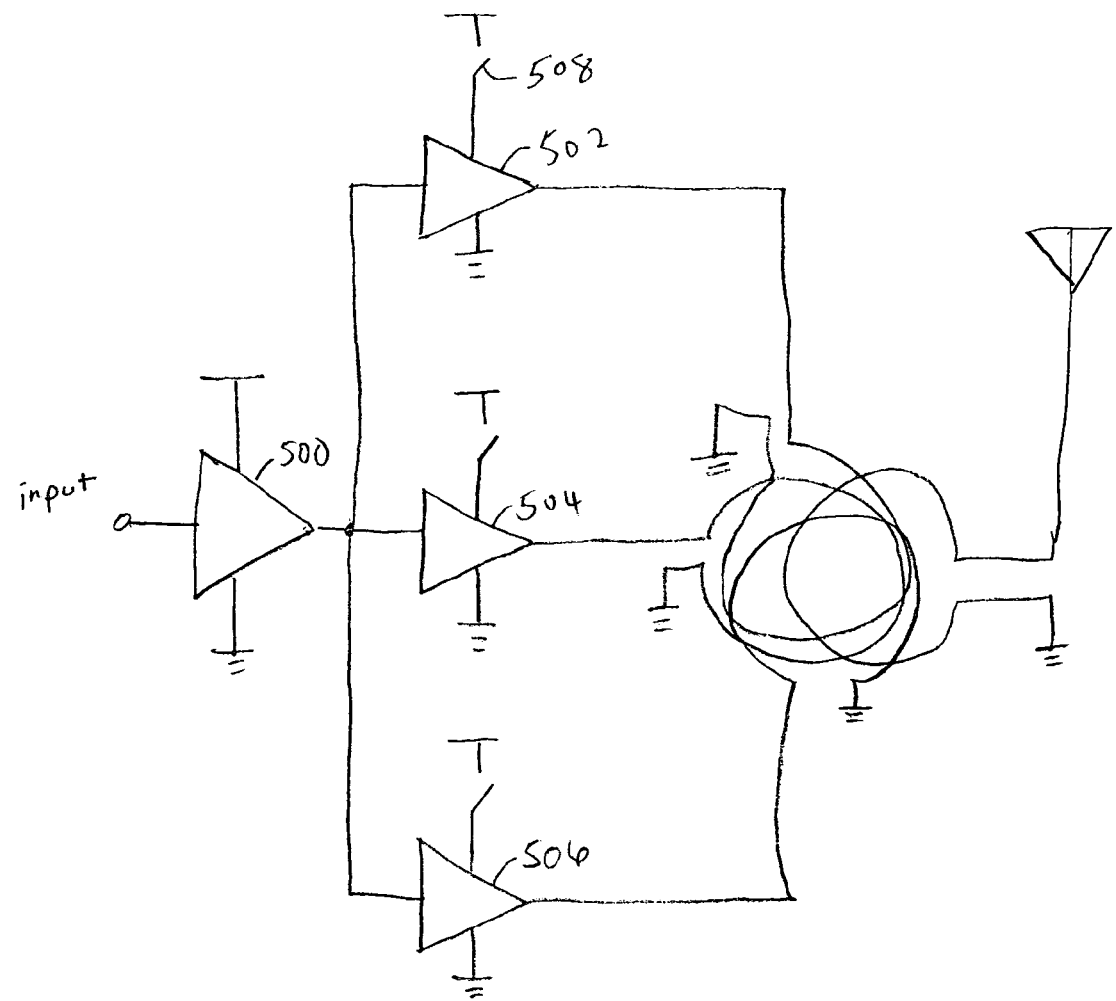
FIG. 5 is a schematic diagram illustrating a transmitter embodiment that employs single-ended amplifiers.

FIG. 5 is a schematic diagram illustrating a transmitter embodiment that employs single-ended amplifiers. In this example, preamp 500 is configured to receive a single input and generate a single output. Similarly amplifiers 502–506 are also single ended amplifiers. The output of amplifiers 502–506 are transmitted to their corresponding inductive loops. Each of the inductive loops (including the inductive loop used to provide the output) has an end that is connected to ground.

Each of the amplifiers includes a switch (such as switch 508) that is configured to connect or disconnect the power amplifier to its power supply. The switches allow the amplifiers to be selectively enabled and disabled to adjust the amount of amplification. For example, amplifier 502 may be disabled while 504 and 506 are enabled. The resulting amplifier provides ⅔ of the amplification achievable if all three amplifiers were enabled. In some embodiments, the amplifier is configured with a controller that selectively enables or disables the amplifiers to obtain a suitable amount of amplification based on certain measurements. Sometimes a system may be in a mode where less amplification is adequate for its proper operation (for example, when a handset is close to a base station), thus the number of amplifiers in use may be reduced to conserve power. Similarly, if the amplifiers employed in the amplification stage are differential amplifiers, they too may be selectively enabled and disabled.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A power amplifier comprising:
   an amplification stage comprising a plurality of amplifiers, wherein each amplifier provides an amplified output; and
   an inductive summing device configured to receive the plurality of amplified outputs and provide a combined output signal, wherein:
   the inductive summing device comprises a plurality of inductive loops;
   each inductive loop is coupled with a corresponding one of the plurality of amplifiers; and
   the plurality of inductive loops are configured to be mutually inductive.

2. The power amplifier as recited in claim 1, wherein the power amplifier receives an input that is balanced, and the combined output signal is unbalanced.

3. A power amplifier as recited in claim 1, further comprising a pre-amplifier configured to amplify an input and send a preamp output to the amplification stage.

4. A power amplifier as recited in claim 1, wherein the plurality of amplifiers are configured in parallel.

5. A power amplifier as recited in claim 1, wherein the inductive summing device comprises a plurality of inductive loops; and one of the inductive loops is coupled with a corresponding one of the plurality of amplifiers.

6. A power amplifier as recited in claim 1, wherein the inductive summing device comprises a plurality of inductive loops; and one of the inductive loops provides the combined output signal.

7. A power amplifier as recited in claim 1, wherein the plurality of amplifiers are configured to have a layout that is approximately symmetrical.

8. A power amplifier as recited in claim 1, wherein the plurality of amplifiers are delay compensated.

9. A power amplifier as recited in claim 1, wherein the plurality of amplifiers are delay compensated to have approximately the same input phase.

10. A power amplifier as recited in claim 1, wherein the plurality of amplifiers are delay compensated to have approximately the same input phase; and the length of input wires of the plurality of amplifiers are approximately equal.

11. A power amplifier as recited in claim 1, wherein the plurality of amplifiers are delay compensated to have approximately the same output phase.

12. A power amplifier as recited in claim 1, wherein the plurality of amplifiers are delay compensated to have approximately the same output phase; and the length of output wires of the plurality of amplifiers are approximately equal.

13. A power amplifier as recited in claim 1, wherein one of the plurality of amplifiers includes a switch that allows said amplifier to be disconnected from the amplification stage.

14. A power amplifier as recited in claim 1, wherein the amplification stage and the inductive summing device are on the same integrated circuit (IC) chip.

15. A method of amplifying a signal, comprising:
    applying the signal to an amplifier stage comprising a plurality of amplifier, wherein each amplifier is configured to provide an amplified output; and
    providing a combined output signal via an inductive summing device configured to receive the plurality of amplified outputs, wherein:
    the inductive summing device comprises a plurality of inductive loops;
    each inductive loop is coupled with a corresponding one of the plurality of amplifiers; and
    the plurality of inductive loops we configured to be mutually inductive.

16. The method of amplifying a signal as recited in claim 15, wherein the power amplifier receives m input that is balanced, and the combined output signal is unbalanced.

17. A method of amplifying a signal as recited in claim 15, further comprising pre-amplifying the signal via a preamp and sending the pre-amplified signal to the amplifier stage.

18. A method of amplifying a signal as recited in claim 15, wherein the plurality of amplifiers are configured in parallel.

19. A method of amplifying a signal as recited in claim 15, wherein the inductive summing device comprises a plurality of inductive loops; and one of the inductive loops is coupled with a corresponding one of the plurality of amplifiers.

20. A method of amplifying a signal as recited in claim 15, wherein the inductive summing device comprises a plurality of inductive loops; and one of the inductive loops provides the combined output signal.

21. A method of amplifying a signal as recited in claim 15, wherein the plurality of amplifiers are configured to have a layout that is approximately symmetrical.

22. A method of amplifying a signal as recited in claim 15, wherein the plurality of amplifiers are delay compensated.

23. A method of amplifying a signal as recited in claim 15, wherein the plurality of amplifiers are delay compensated to have approximately the same input phase.

24. A method of amplifying a signal as recited in claim 15, wherein the plurality of amplifiers are delay compensated to have approximately the same input phase; and the length of input wires of the plurality of amplifiers are approximately equal.

25. A method of amplifying a signal as recited in claim 15, wherein the plurality of amplifiers are delay compensated to have approximately the same output phase.

26. A method of amplifying a signal as recited in claim 15, wherein the plurality of amplifiers are delay compensated to have approximately the same output phase; and the length of output wires of the plurality of amplifiers are approximately equal.

27. A method of amplifying a signal as recited in claim 15, wherein one of the plurality of amplifiers includes a switch that allows said amplifier to be disconnected from the amplification stage.

28. A method of amplifying a signal as recited in claim 15, wherein the amplification stage and the inductive summing device are on the same integrated circuit (IC) chip.

* * * * *